(12) United States Patent
Sano et al.

(10) Patent No.: US 8,043,879 B2
(45) Date of Patent: Oct. 25, 2011

(54) SEMICONDUCTOR LIGHT EMITTING DEVICE MANUFACTURE METHOD

(75) Inventors: Michihiro Sano, Kanagawa (JP);
Hiroyuki Kato, Kanagawa (JP);
Naochika Horio, Kanagawa (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 12/904,063

(22) Filed: Oct. 13, 2010

(65) Prior Publication Data

US 2011/0027922 A1  Feb. 3, 2011

Related U.S. Application Data

(60) Continuation of application No. PCT/JP2006/310245, filed on May 23, 2006, and a division of application No. 12/025,044, filed on Feb. 3, 2008, now Pat. No. 7,834,371.

(30) Foreign Application Priority Data

Aug. 3, 2005  (JP) ................. 2005-225875

(51) Int. Cl.
*H01L 21/00* (2006.01)
(52) U.S. Cl. ... 438/46; 438/104; 257/103; 257/E33.037; 257/E33.072
(58) Field of Classification Search .......... 438/46, 438/104; 257/103, E33.037, E33.072
See application file for complete search history.

(56) References Cited

U.S. PATENT DOCUMENTS

| 2004/0072383 A1 | 4/2004 | Nagahama et al. |
| 2004/0104395 A1 | 6/2004 | Hagimoto et al. |
| 2004/0191939 A1 | 9/2004 | Kon et al. |

FOREIGN PATENT DOCUMENTS

| JP | 2002-111059 A | 4/2002 |
| JP | 2004-266240 A | 9/2004 |
| JP | 2004-281863 A | 10/2004 |
| JP | 2004-296846 A | 10/2004 |
| JP | 2004-342732 A | 12/2004 |
| JP | 2005-079298 A | 3/2005 |
| JP | 2005-109207 A | 4/2005 |

OTHER PUBLICATIONS

Christen et al., "Luminescene Micro-Characterization of epitaxial ZnO and ZnO heterostructures", http://physik.unihalle.de/FG/seminars/ws2005/abstracts/it/i6.htm, 2 pages, printed from the Internet on Jan. 26, 2006.

(Continued)

*Primary Examiner* — Minh-Loan T Tran
(74) *Attorney, Agent, or Firm* — Chen Yoshimura LLP

(57) ABSTRACT

A semiconductor light emitting device manufacture method is provided which can manufacture a semiconductor light emitting device of high quality. A first substrate of an n-type ZnO substrate is prepared. A lamination structure including an optical emission layer made of ZnO based compound semiconductor is formed on the first substrate. A p-side conductive layer is formed on the lamination structure. A first eutectic material layer made of eutectic material is formed on the p-side conductive layer. A second eutectic material layer made of eutectic material is formed on a second substrate. The first and second eutectic material layers are eutectic-bonded to couple the first and second substrates. After the first substrate is optionally thinned, an n-side electrode is formed on a partial surface of the first substrate.

10 Claims, 11 Drawing Sheets

OTHER PUBLICATIONS

Iwata et al., "Bandgap Engineering of ZnO Using Se", Phys. Stat. Sol. (b) 229, No. 2, pp. 887-890, 2002.

"Property of Oxides—II-VI zoku sankabutsu handoutai no kiso bussei", Research Initiatives at Kyoto University International Innovation Center, http://www.iic.kyoto-u.ac.jp/sozo/fujita/research/zno/prop.html, 2 pages, printed from the Internet on Jan. 31, 2008.

Meyer et al., "Structural properties and bandgap bowing of ZnO1-xSx thin films deposited by reactive sputtering", Applied Physics Letters, vol. 85, No. 21, pp. 4929-4931, Nov. 22, 2004.

International Search Report (ISR) issued in PCT/JP2006/310245 (parent application) mailed in Jun. 2006 for Examiner consideration.

Written Opinion (PCT/ISA/237) issued in PCT/JP2006/310245 (parent application) mailed in Jun. 2006.

| Cd COMPOSITION (x) | ENERGY GAP (eV) | WAVELENGTH (nm) |
|---|---|---|
| 0.16 | 3.18 | 390 |
| 0.19 | 3.14 | 395 |
| 0.23 | 3.10 | 400 |
| 0.55 | 2.72 | 455 |

| Se COMPOSITION (y) | BOND LENGTH (Å) | ENERGY GAP (eV) | WAVELENGTH (nm) |
|---|---|---|---|
| 0.0000 | 1.990 | 3.41 | 364 |
| 0.0178 | 1.998 | 3.18 | 390 |
| 0.0210 | 2.000 | 3.14 | 395 |
| 0.0240 | 2.001 | 3.10 | 400 |
| 0.0540 | 2.015 | 2.73 | 455 |
| 0.0565 | 2.016 | 2.70 | 460 |
| 0.0856 | 2.029 | 2.36 | 525 |
| 0.0955 | 2.034 | 2.25 | 550 |
| 0.1064 | 2.039 | 2.14 | 580 |
| 0.1227 | 2.046 | 1.97 | 630 |
| 0.1316 | 2.051 | 1.88 | 660 |

FIG. 8C

| S COMPOSITION (z) | ENERGY GAP (eV) | WAVELENGTH (nm) |
|---|---|---|
| 0.009 | 3.18 | 390 |
| 0.025 | 3.14 | 395 |
| 0.040 | 3.10 | 400 |
| 0.057 | 3.06 | 405 |
| 0.187 | 2.82 | 440 |
| 0.235 | 2.75 | 450 |
| 0.295 | 2.69 | 460 |
| 0.400 | 2.64 | 470 |

SEMICONDUCTOR LIGHT EMITTING DEVICE MANUFACTURE METHOD

This application is a divisional of a pending application, U.S. Ser. No. 12/025,044 filed on Feb. 3, 2008, which is hereby incorporated by reference in its entirety.

This application is a continuation of PCT International Application PCT/JP2006/310245 filed on May 23, 2006. As such, this application claims the benefit of PCT International Application PCT/JP2006/310245 filed on May 23, 2006, which claims the benefit of Japanese patent application No. 2005-225875, filed in Japan on Aug. 3, 2005, both of which are hereby incorporated by reference in its entireties.

BACKGROUND OF THE INVENTION

A) Field of the Invention

The present invention relates to a ZnO (zinc oxide) based compound semiconductor light emitting device and its manufacture method.

B) Description of the Related Art

A semiconductor light emitting device having an active layer made of ZnO based compound semiconductor is known as disclosed in JP-A-2002-111059 and JP-A-2004-342732. ZnO based compound semiconductor includes not only ZnO but also mixed crystal such as MgZnO (magnesium zinc oxide) and CdZnO (cadmium zinc oxide) having ZnO as host crystal.

FIGS. 5A and 5B are schematic cross sectional views of semiconductor light emitting devices having an active layer made of ZnO based compound semiconductor.

With reference to FIG. 5A, a manufacture method for a semiconductor light emitting device having an active layer made of ZnO based compound semiconductor will be described.

An n-type ZnO buffer layer 52 having a thickness of 10 to 1000 nm is formed on an n-type ZnO substrate 51 at a temperature of 300 to 500° C. Next, an n-type ZnO layer 53 doped with Ga and having a thickness of 1 µm or thicker is formed on the n-type ZnO buffer layer 52. The thickness of 1 µm or thicker mitigates the influence of defects invading from an interface between the n-type ZnO substrate 51 and n-type ZnO buffer layer 52 and sufficiently retains the functions of upper layers over the n-type ZnO layer 53.

An n-type MgZnO layer 54 doped with Ga is formed on the n-type ZnO layer 53. The n-type MgZnO layer 54 has functions of an n-type carrier injection layer and of a carrier confinement layer.

Next, an active layer 55 is formed on the n-type MgZnO layer 54. The active layer 55 has, for example, a double hetero (DH) structure or a quantum well (QW) structure.

In the case of the DH structure, the active layer 55 is made of an undoped ZnO layer, CdZnO layer, ZnOS layer, ZnOSe layer or ZnOTe layer. In the case of the QW structure, the active layer 55 has a lamination structure of, e.g., a thin film MgZnO/ZnO (or CdZnO, or ZnOS, or ZnOSe or ZnOTe)/MgZnO.

A p-type MgZnO layer 56 doped with N is formed on the active layer 55. The p-type MgZnO layer 56 has a function of a p-type carrier injection layer. The p-type MgZnO layer 56 has a low carrier concentration and a low carrier mobility and therefore has a high resistivity. Therefore, in order to form an ohmic electrode, a p-type ZnO layer 57 doped with N is formed on the p-type MgZnO layer 56.

After the p-type ZnO layer 57 is formed, a p-side ohmic electrode 58 is formed. The p-side ohmic electrode 58 is an electrode formed on a partial surface area of the p-type ZnO layer 57, and has a circular form, for example.

An n-side ohmic electrode 50 is formed on the surface of the n-type ZnO substrate 51 opposite to the n-type ZnO buffer layer 52. For example, the n-side ohmic electrode 50 is made of Al having a thickness of 100 nm.

In the semiconductor light emitting device shown in FIG. 5A, light is output from the p-type side having a high resistivity (low carrier mobility). This is why the p-side ohmic electrode 58 is formed on a partial surface area.

Due to a large effective mass of holes, the mobility of holes is, for example, as small as several $cm^2/Vs$. As a result, the p-type ZnO layer 57 exhibits a high resistivity. Each layer of the semiconductor light emitting device shown in FIG. 5A has a very small size in a thickness direction as compared to that in an in-plane direction. Therefore, as current is made to flow in the semiconductor light emitting device having the structure shown in FIG. 5A, current flows mainly in the thickness direction so that the current is likely to be injected only in the region just under the p-side ohmic electrode 58 on the partial surface area, and hardly diffuse in the in-plane direction of each layer. Therefore, emission of the active layer 55 occurs only in the region just under the p-side ohmic electrode 58. Most of radiated light may be shielded by the electrode and will not be output to the exterior in some cases.

FIG. 5B shows a modification of the semiconductor light emitting device shown in FIG. 5A. This device of FIG. 5B differs from the semiconductor light emitting device shown in FIG. 5A in that a transparent electrode 59 having a thickness of 15 nm and made of, e.g., Ni, is formed on a p-type ZnO layer 57, and a p-side bonding electrode 60 having a thickness of 100 nm and made of, e.g., Au, is formed on the transparent electrode 59.

This transparent electrode 59 can solve the problem that most of radiated light may be shielded by the electrode and will not be output to the exterior. However, in the manufacture of a semiconductor light emitting device, an additional process is required for forming the transparent electrode 59. Another problem is that radiated light is absorbed in the transparent electrode and the amount light output is reduced.

It can be considered that a p-type ZnO substrate is prepared and a p-type ZnO layer and other layers are formed from the p-type side to manufacture a semiconductor light emitting device having a light output plane on the n-type ZnO layer side. In this case, it is difficult to form a device having good crystallinity. In forming a p-type ZnO layer, it is necessary to set an impurity doping amount larger than when the n-type ZnO layer is formed, and crystallinity is degraded as the doping amount is increased. This is because a large amount of impurities doped in the p-type ZnO layer adversely affects each layer to be formed thereafter.

It is also difficult to form a p-type ZnO substrate itself. A large amount of impurities is required to form a p-type ZnO substrate. However, the substrate is required to be formed under a nonequilibrium state because the solubility of impurities is small in an equilibrium state. However, a large sized, thick substrate is produced industrially through growth in an equilibrium state.

SUMMARY OF THE INVENTION

It is an object of the present invention to provide a semiconductor light emitting device of high quality.

It is another object of the present invention to provide a manufacture method capable of manufacturing a light emitting device of high quality.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in one aspect, the present invention provides a semiconductor light emitting device manufacture method including (a) preparing a first substrate of an n-type ZnO substrate, (b) forming a lamination structure including an optical emission layer made of ZnO based compound semiconductor over said first substrate, (c) forming a p-side conductive layer over said lamination structure, (d) forming a first eutectic material layer made of eutectic material over said p-side conductive layer, (e) preparing a second substrate having an electric conductivity, (f) forming a second eutectic material layer made of eutectic material over said second substrate, (g) performing eutectic bonding of said first eutectic material layer and said second eutectic material layer so that the first substrate is oriented upside down, and (h) forming an n-side electrode over a partial surface of said first substrate.

In another aspect, the present invention provides a semiconductor light emitting device including a conductive substrate, a eutectic material layer made of eutectic material, disposed over said conductive substrate, a p-side conductive layer over said eutectic material layer, a lamination structure including an optical emission layer made of ZnO based compound semiconductor, disposed over said p-side conductive layer, a current diffusion layer made of n-type ZnO, disposed over said lamination structure, and an n-side electrode over a partial surface of said current diffusion layer.

In another aspect, the present invention provides a semiconductor light emitting device manufacture method including preparing a first substrate of an n-type ZnO substrate, forming a lamination structure including an optical emission layer made of ZnO based compound semiconductor over said first substrate, forming a p-side conductive layer over said ohmic contact layer, preparing a second substrate, thereafter bonding the first substrate that is turned upside down to the second substrate such that a p-side conductive layer side of the first substrate faces the second substrate, and forming an n-side electrode over a partial area of a surface of said first substrate that is opposite to the p-side conductive layer side.

In another aspect, the present invention provides a semiconductor light emitting device including a substrate, a p-side conductive layer over said substrate, a lamination structure including an optical emission layer made of ZnO based compound semiconductor, disposed over said p-side conductive layer, a current diffusion layer made of n-type ZnO, disposed over said lamination structure, and an n-side electrode over a partial surface of said current diffusion layer, wherein a thickness of the current diffusion layer is such that the current diffusion layer is substantially transparent with respect to an emission spectrum of said optical emission layer, and wherein said thickness, lateral dimensions, and a conductivity of the current diffusion layer are such that, in operation, electrons from said n-side electrode diffuse to cover a substantially entire bottom surface of said current diffusion layer so that emission occurs in a substantially entire area of said optical emission layer.

It is to be understood that both the foregoing general description and the following detailed description are exemplary and explanatory, and are intended to provide further explanation of the invention as claimed

BRIEF DESCRIPTION OF THE DRAWINGS

FIG. 8C is a table showing values of energy gaps and wavelengths relative to discrete values of the S composition (z) in the range of 0.009 to 0.400.

DESCRIPTION OF THE PREFERRED EMBODIMENTS

FIGS. 1A to 1H are schematic cross sectional views illustrating a manufacture method for a semiconductor light emitting device according to an embodiment. Although FIGS. 1A to 1H describe a structure forming process for a single chip, a plurality of chips may be manufactured simultaneously using a large substrate with appropriate patterning/etching processes, followed by scribing/dicing processes, for example.

Figure 1A:
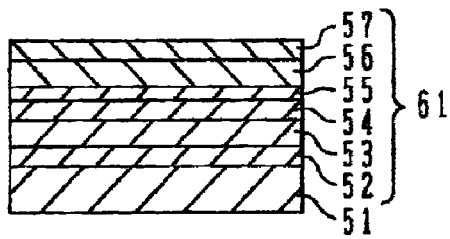
FIGS. 1A to 1H are schematic cross sectional views illustrating a manufacture method for a semiconductor light emitting device according to an embodiment.

Reference is made to FIG. 1A. An n-type ZnO buffer layer 52 having a thickness of about 10 nm to about 1000 nm is formed at a temperature of about 300° C. to about 500° C. on an n-type ZnO substrate 51 having a thickness of about 300 µm to about 500 µm. As will be later described, although the n-type ZnO substrate 51 functions as a current diffusion layer after the device is finished, it temporarily functions as a growth substrate during the manufacture. Therefore, the substrate has preferably a thickness of about 300 µm to about 500 µm in order to retain flatness and mechanical strength.

An n-type ZnO layer 53 having a thickness of about 1 μm or thicker is formed on the n-type ZnO buffer layer 52 at a temperature higher than the growth temperature of the n-type ZnO buffer layer 52, e.g., at about 300° C. to about 1000° C. The thickness is set to about 1 μm or thicker to mitigate the influence of defects invading from an interface between the n-type ZnO substrate 51 and n-type ZnO buffer layer 52 and to improve surface crystallinity.

On the n-type ZnO layer 53, an n-type MgZnO layer 54 is formed to a thickness of about 200 nm, functioning as an n-type carrier injection layer and a carrier confinement layer (clad layer).

An active layer 55 is formed on the n-type MgZnO layer 54. For example, the active layer 55 is a layer having a DH structure or a QW structure and has a thickness of about 30 nm to 100 nm.

In the case of the DH structure, an undoped or properly conductive ZnO layer, CdZnO layer, ZnOS layer, ZnOSe layer or ZnOTe layer is used as the active layer 55.

In the case of the QW structure, the active layer 55 has a repeated or single lamination structure of, e.g., thin films MgZnO/ZnO (or CdZnO, or ZnOS, or ZnOSe or ZnOTe)/MgZnO. In this case, the ZnO layer or the like constitutes a well and the MgZnO layer constitutes a barrier.

If the n-type ZnO substrate 51 is used, as will be later described in more detail, CdZnO, ZnOS, ZnOSe or ZnOTe is used as the material of the active layer 55 more preferably than ZnO. This is because optical emission from the ZnO active layer is influenced by self-absorption by the n-type ZnO substrate 51.

On the active layer 55, a p-type MgZnO layer 56 is formed having a thickness of, e.g., about 200 nm. The p-type MgZnO layer 56 functions as a p-type carrier injection layer.

On the p-type MgZnO layer 56, a p-type ZnO layer 57 is formed having a thickness of about 100 nm to about 200 nm.

The lamination structure from the n-type ZnO buffer layer 52 formed on the n-type ZnO layer 51 to the p-type ZnO layer 57 is called an optical emission lamination structure 61.

The optical emission lamination structure 61 is formed, for example, by molecular beam epitaxy (MBE). In forming the optical emission lamination structure 61, for example, Ga is used as an n-type dopant to be doped in the n-type ZnO layer 53 and n-type MgZnO layer 54. Al, In, or the like may also be used. As a p-type dopant to be doped in the p-type MgZnO layer 56 and p-type ZnO layer 57, for example, N is used. As, P, or the like may also be used.

Addition of both n- and p-type dopants is preferably performed at a carrier concentration of about $5 \times 10^{17}$ cm$^{-3}$ to about $1 \times 10^{19}$ cm$^{-3}$. However, there was a case in which optical emission of the device was confirmed at a carrier concentration of $2 \times 10^{16}$ cm$^{-3}$, and such a low dosage can be used in appropriate circumstances.

Figure 1B:
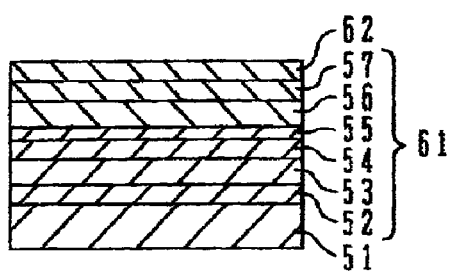

Reference is made to FIG. 1B. A p-side conductive layer 62 (also referred to as "p-side ohmic reflection layer" when it has a significant reflectivity) is formed on the p-type ZnO layer 57. The p-side ohmic reflection electrode 62 may be used as a total reflection electrode on the p-type ZnO layer 57.

For example, the p-side ohmic reflection electrode 62 is constituted of two layers of an ohmic material layer and a high reflectivity material layer. The ohmic material layer is made of Ti, Ni or the like and formed on the optical emission lamination structure 61 (on p-type ZnO layer 57), providing an ohmic contact with the optical emission lamination structure 61. The high reflectivity material layer is made of high reflectivity material such as Al, Ag, Rh and Pd and formed on the ohmic material layer. The high reflectivity material layer can effectively reflect light input from the optical emission lamination structure 61 side toward the optical output plane side (n-type ZnO substrate 51 side). One example of the structure of the p-side ohmic reflection electrode 62 may adopt a lamination structure of an Ni layer (ohmic material layer) having a thickness of about 1 nm and an Ag layer (high reflectivity material layer) having a thickness of about 2000 nm. In this case, the p-side ohmic reflection electrode 62 may be formed by an electron beam, thermal vapor deposition (EB method) or a sputtering method, for example. Materials of the p-side ohmic reflection electrode 62 will be later discussed in more detail.

Figure 1C:
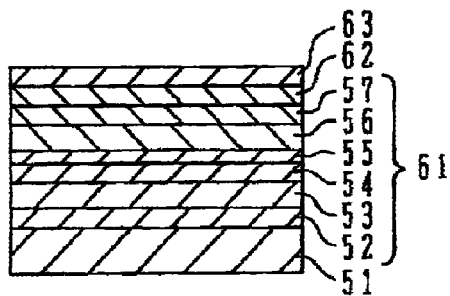

Reference is made to FIG. 1C. On the p-side ohmic reflection electrode 62, an Au layer 63 having a thickness of, e.g., about 200 nm is formed by sputtering. The Au layer 63 is used for eutectic bonding at a later process.

Figure 1D:

Reference is made to FIG. 1D. A silicon substrate 64 doped with n- or p-type impurities at a high concentration is prepared. Au layers 65 and 66 are vapor-deposited on both surfaces of the silicon substrate 64 and alloyed at 400° C. in a nitrogen atmosphere, by a process different from those described with reference to FIGS. 1A to 1C. A thickness of each of the Au layers 65 and 66 is, for example, about 150 nm to about 600 nm. With alloying, the silicon substrate 64 and Au layers 65 and 66 are integrated to form a eutectic alloy, establishing ohmic contacts. The Au layers 65 and 66, therefore, will not be peeled off from the silicon substrate 64.

Figure 1E:
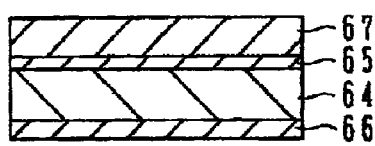

Reference is made to FIG. 1E. On the Au layer 65, an AuSn layer 67 is vapor-deposited by the EB method, sputtering method or the like to a thickness of about 600 nm to about 1200 nm. The composition of the AuSn layer 67 is Au:Sn=about 20:about 80 in weight ratio, for example.

Figure 1F:
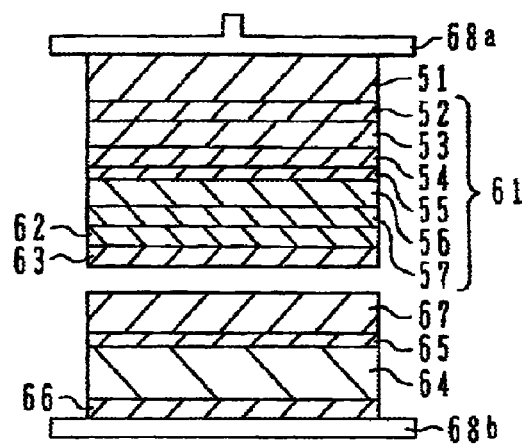

Reference is made to FIG. 1F. The structural bodies shown in FIGS. 1C and 1E are held on support stages 68a and 68b, with the Au layer 63 and AuSn layer 67 facing each other, and the structural bodies are coupled together by eutectic bonding. The eutectic bonding is performed, for example, by thermocompression bonding (metal bonding). The thermocompression bonding is a bonding method of raising a temperature to an eutectic material melting point and applying a pressure. Bonding the AuSn layer 67 and Au layer 63 is performed by pressing the layers at a pressure of about 1 MPa for 10 minutes at a temperature of 300° C. in a nitrogen atmosphere, for example.

Figure 1G:
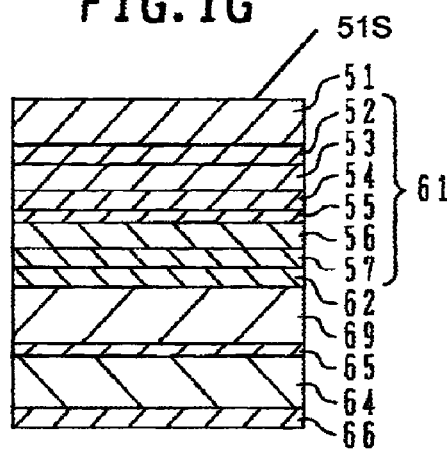

Reference is made to FIG. 1G. An Au—Sn eutectic bonding pad 69 is formed by eutectic bonding between the Au layer 63 and AuSn layer 67. The two structural bodies shown in FIGS. 1C and 1E are therefore bonded together.

Next, the n-type ZnO substrate 51 having the thickness of about 300 μm to about 500 μm is thinned to a desired thickness by grinding. For example, Al$_2$O$_3$ powders having a grain diameter of about 5 μm to about 10 μm are used for grinding. To what degree of the thickness the n-type ZnO substrate 51 should be ground will be later detailed. The ground n-type ZnO substrate 51 functions as a current diffusion layer in the finished device.

The ground plane may be dry or wet etched to form a textured surface profile. The textured surface can improve an optical output efficiency of the semiconductor light emitting device. This etching can also remove grinding damages. The textured surface profile may be a roughed surface, concave and/or convex profile.

Figure 1H:
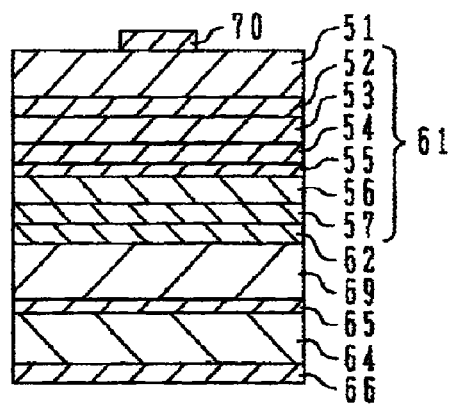

Reference is made of FIG. 1H. An n-side ohmic electrode 70 as a partial electrode is formed on a partial surface area of the n-type ZnO substrate 51 that has been ground and formed with the textured surface structure. For example, the n-side ohmic electrode 70 is made of Al and has a thickness of about 100 nm.

The n-side ohmic electrode 70 is formed, for example, by a lift-off method. With the lift-off method, a photoresist is coated on the n-type ZnO substrate 51 and exposed by using a photomask to form an opening of a desired electrode shape, and electrode material is vapor deposited and thereafter, the photoresist and the metal layer on the photoresist are removed. The EB method, sputtering method and the like may be used as the electrode material vapor deposition method.

With the processes described above, the semiconductor light emitting device of the embodiment can be manufactured.

In the semiconductor light emitting device of the embodiment, the Au layer 63 and AuSn layer 67 are formed as eutectic material layers. The Au layer 63 and AuSn layer 67 may be made of other eutectic materials (soldering materials), such as those essentially consisting of Au such as AuGe and AuSi, for example, not limited to Au and AuSn.

However, materials having an eutectic temperature higher than a growth temperature of each layer may damage the optical emission lamination structure 61 and are not suitable for the eutectic material layer. When the light emitting device manufactured by the manufacture method described with reference to FIGS. 1A to 1H is mounted on a package substrate by using solder at a later process, it is not preferable to use general soldering material as bonding layer material.

In the manufacture method for the semiconductor light emitting device of the embodiment, the lamination structural body having the optical emission lamination structure 61 is bonded to the support structural body (the structural body of a lamination structure of the Au layer 66, silicon substrate 64, Au layer 65 and AuSn layer 67 shown in FIG. 1E). It is therefore possible to retain a mechanical strength and improve a handling efficiency while the n-type ZnO substrate 51 is ground. Further, heat generated during the operation of the manufactured semiconductor light emitting device can be efficiently dissipated via the silicon substrate 64.

The structure of the support structural body can be properly selected in accordance with the structure, characteristics or usage of a semiconductor light emitting device to be manufactured. For example, in the embodiment, although the silicon substrate is used as the support structural body, other substrates may preferably be used, such as, for example, a Cu substrate which has a high electric conductivity and a high thermal conductivity, and a substrate made of material capable of being alloyed with Au.

Due to the appropriately selected size and material of the support structural body, it becomes possible to manufacture a semiconductor light emitting device excellent not only in a mechanical strength but also in electric conductivity and heat dissipation.

In the semiconductor light emitting device of the embodiment shown in FIG. 1H, light is radiated in the active layer 55 and outputs from the optical output plane (the plane of n-type ZnO substrate 51 formed with the textured surface structure) on the side of the n-side ohmic electrode 70. Since light is not output from the p-type side, the p-side ohmic reflection electrode 62 can be used as a whole plane electrode. The n-side ZnO substrate 51 has a current diffusion function. Therefore, current can be diffused in the whole area in the in-plane directions of each layer and the active layer 55 can radiate light from a broad area (e.g., from a substantially entire area) in the in-plane directions. It is therefore possible to output more light to the exterior than the case in which a radiative region is localized in the region under the electrode and in its vicinity.

Also in the semiconductor light emitting device of the embodiment, of light radiated in the active layer 55, light propagating toward the p-side ohmic reflection electrode 62 side is reflected by the electrode 62 toward the optical output plane side. Further, the semiconductor light emitting device is provided with a textured surface structure on the optical output plane. Therefore, the semiconductor light emitting device of the embodiment has a high optical output efficiency.

According to the manufacture method for the semiconductor light emitting device described with reference to FIGS. 1A to 1H, the n-type ZnO substrate 51 temporarily used as the growth substrate is ground to a target thickness so as to be used as a current diffusion layer. Therefore, there is no need to form a separate current diffusion layer. Since such an additional current diffusion layer forming process, which could take a long time to form the layer, can be omitted, it is possible to reduce manufacture time for the semiconductor light emitting device.

Further, since the thickness of the current diffusion layer (n-type ZnO substrate 51) can be controlled by grinding, a current diffusion layer suitable for efficient light output can be realized easily.

As described above, a semiconductor light emitting device having improved properties can be efficiently manufactured by the semiconductor light emitting device manufacture method of the embodiment.

Figure 2:
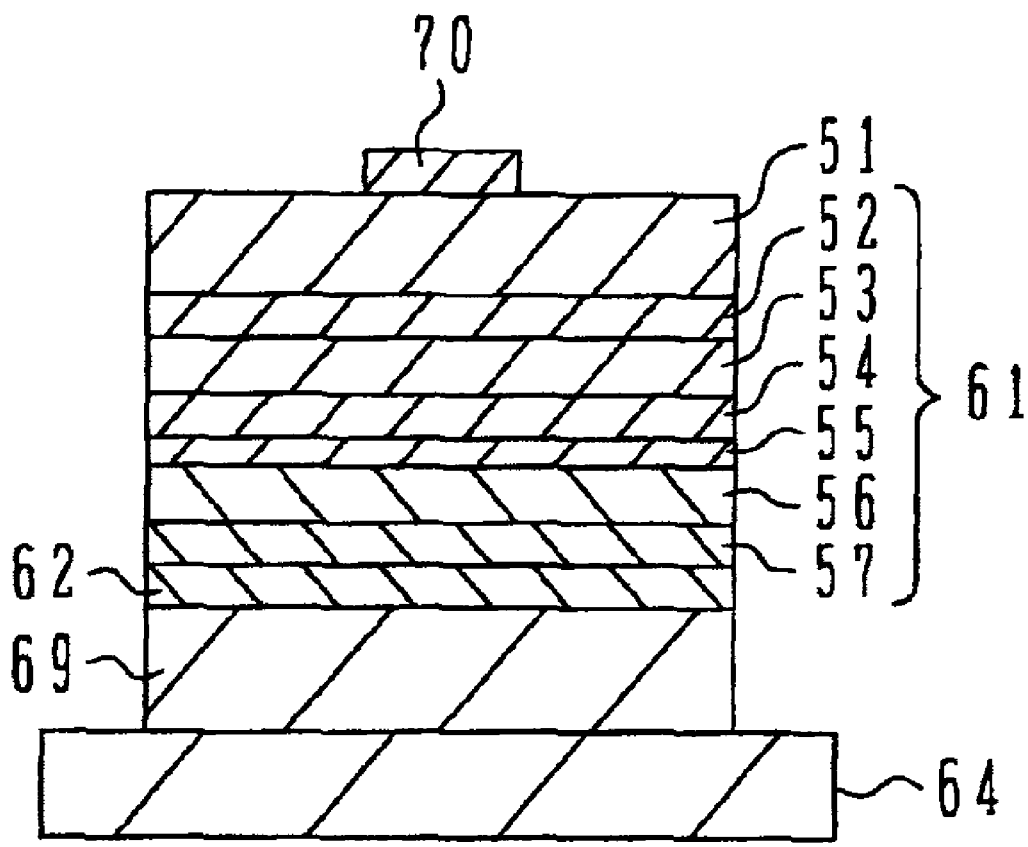
FIG. 2 is a schematic cross sectional view showing a modification of the semiconductor light device of the embodiment.

FIG. 2 is a schematic cross sectional view showing a modification of the semiconductor light emitting device of the above embodiment. This semiconductor light emitting device differs from the semiconductor light emitting device of the embodiment shown in FIG. 1H in that an area of a silicon substrate 64 is larger than that of the n-type ZnO substrate 51 and that the Au layers 65 and 66 are not formed.

Dissipation of heat generated during the operation of the semiconductor light emitting device can be further improved by making the area of the silicon substrate 64 larger than that of the n-type ZnO substrate 51 (e.g., by twice as large or more).

Figure 3:
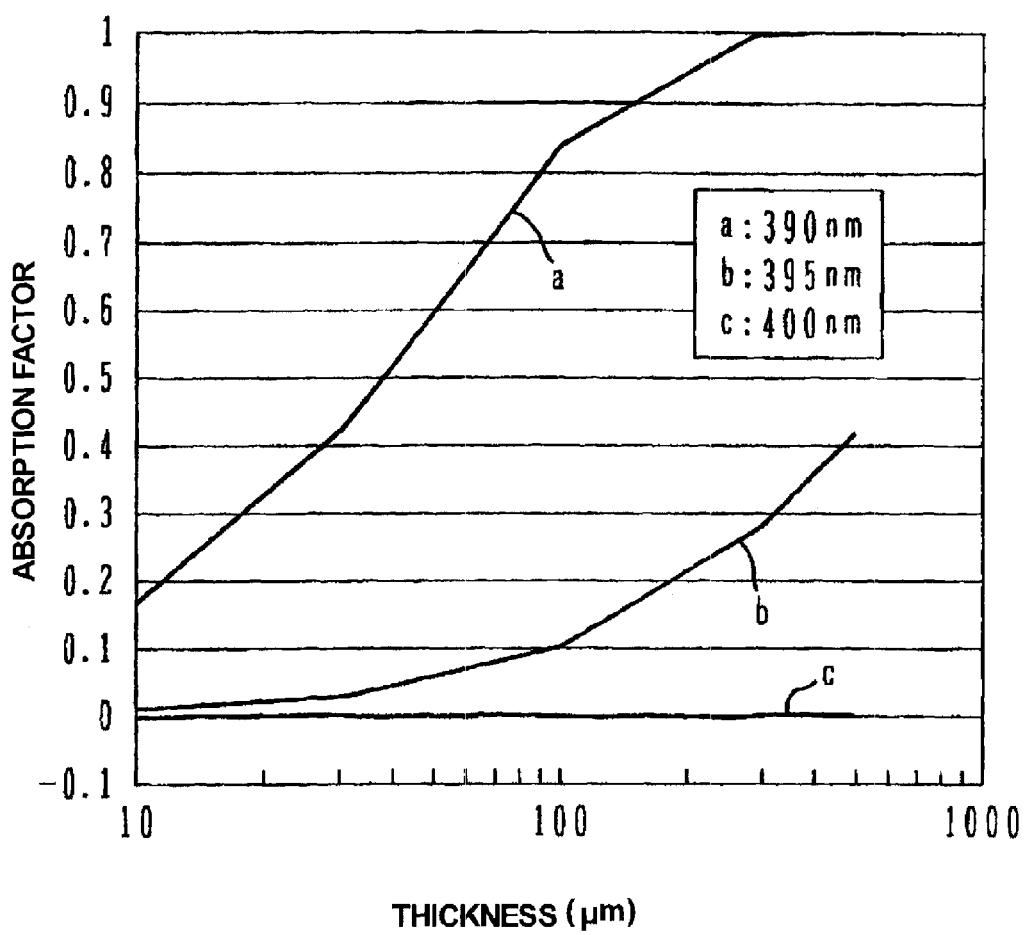
FIG. 3 is a graph showing the relation between a thickness and a light absorption factor of ZnO substrates.

FIG. 3 is a graph showing the relation between the thickness and the optical absorption factor of a ZnO substrate.

The abscissa of the graph represents a thickness of ZnO substrates in the unit of "μm" in a logarithmic scale. The ordinate of the graph represents the optical absorption factor in a linear scale. Graphs a, b and c represent the relation between the thickness and the optical absorption factor of a ZnO substrate relative to light having wavelengths of 390 nm, 395 nm and 400 nm, respectively.

The center wavelength of emission of ZnO is 378 nm. The absorption factor for light having a wavelength near 378 nm is therefore high. Namely, the absorption factor becomes higher in the order of 390 nm (graph a), 395 nm (graph b) and 400 nm (graph c). It can also be understood that light having a wavelength of about 390 nm or shorter is easily absorbed and that the absorption factor of light having a wavelength of 400 nm is almost 0 irrespective of its thickness.

The materials CdZnO, ZnOS, ZnOSe or ZnOTe, which is described above as capable of being used as the material of the active layer, have the center emission wavelengths that are longer than the center emission wavelength of ZnO. Therefore, if n-type ZnO is used as the substrate material, the active layer is preferably formed by using CdZnO, ZnOS, ZnOSe or ZnOTe. In this case, it is possible to reduce the amount of light absorbed in the substrate, thereby further improving the optical output efficiency.

Figure 4:
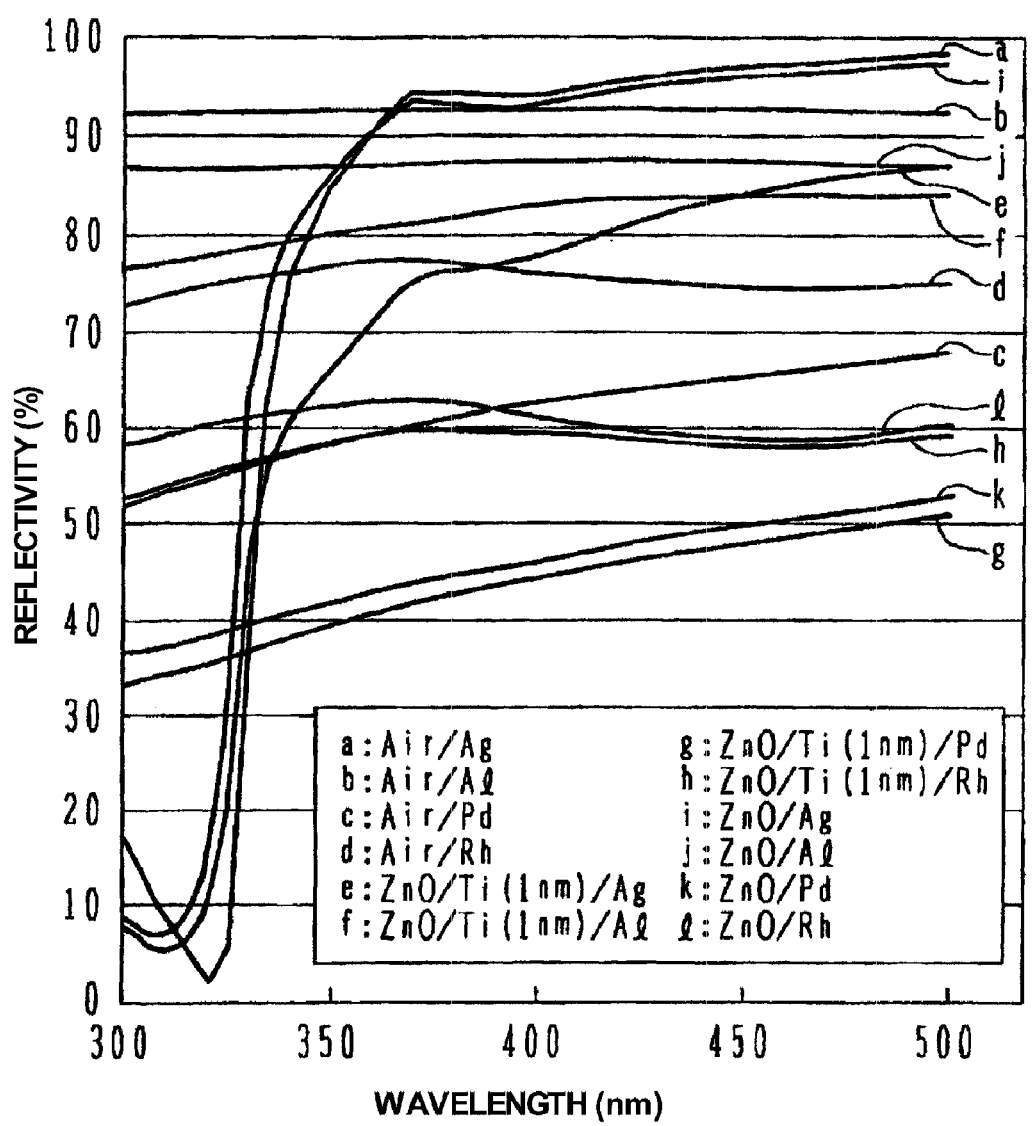
FIG. 4 is a graph showing the relation between an incidence light wavelength and a reflectivity for high reflectivity metals and for lamination structures using high reflectivity metal.

With reference to FIG. 4, the material of the p-side ohmic reflection electrode will be studied. FIG. 4 is a graph showing the relation between the wavelength and the reflectivity of incidence light for high reflectivity metals and for lamination structures using high reflectivity metal.

The abscissa of the graph represents the wavelength of incidence light in the unit of "nm". The ordinate of the graph represents the optical reflectivity of various high reflectivity metals and lamination structures using high reflectivity metal in the unit of "%". Graphs a, b, c and d represent the relation between the wavelength and the optical reflectivity of Ag, Al, Pd and Rh, respectively. Graphs e, f, g and h represent cases of lamination structural bodies forming Ag, Al, Pd and Rh layers, respectively, on a laminated structure of ZnO layer/1 nm Ta layer/(Ag, Al, Pd, or Rh). Graphs i, j, k and l represent cases of lamination structural bodies forming Ag, Al, Pd and Rh layers, respectively, on a ZnO layer.

Reference is made to the graphs a, e and i. These graphs correspond to cases using a high reflectivity metal of Ag. As shown in the graphs, in the wavelength range of 378 nm (center wavelength of emission of ZnO) or longer, these samples are arranged in the order graph a (Ag), graph i (ZnO/Ag) and graph e (ZnO/Ti/Ag) from the largest to the smallest reflectivity among them.

Reference is made to the graphs b, f and j. These graphs correspond to cases using a high reflectivity metal of Al. As shown in the graphs, in the wavelength range of 378 nm or longer, these samples are arranged in the order of graph b (Al), graph j (ZnO/Al) and graph f (ZnO/Ti/Al) from the largest to the smallest reflectivity among them.

Reference is made to the graphs c, g and k. These graphs correspond to cases of using a high reflectivity metal of Pd. As shown in the graphs, in the wavelength range of 378 nm or longer, these samples are arranged in the order of graph c (Pd), graph k (ZnO/Pd) and graph g (ZnO/Ti/Pd) from the largest to the smallest reflectivity among them.

Reference is made to the graphs d, h and l. These graphs correspond to cases using a high reflectivity metal of Rh. As shown in the graphs, in the wavelength range of 378 nm or longer, these samples are arranged in the order of graph d (Rh), graph l (ZnO/Rh) and graph h (ZnO/Ti/Rh) from the largest to the smallest reflectivity among them.

Thus, as compared to "high reflectivity metal" and corresponding "ZnO/high reflectivity metal", the corresponding lamination structural body of "ZnO/Ti/high reflectivity metal" has a lower reflectivity in the wavelength range of 378 nm or longer.

However, among the laminated structural bodies of "ZnO/Ti/high reflectivity metal," in the wavelength range of 378 nm or longer, "ZnO/Ti/Al" (graph f) and "ZnO/Ti/Ag" (graph e) have higher reflectivities than that of "ZnO/Ti/Rh" (graph h) and "ZnO/Ti/Pd" (graph g).

In the wavelength range of 378 nm or longer, "ZnO/Ti/Al" (graph f) has a reflectivity over 80%, and "ZnO/Ti/Ag" (graph e) also has a reflectivity over 75%. In the wavelength range of about 450 nm or longer, the reflectivity of "ZnO/Ti/Ag" (graph e) is higher than that of "ZnO/Ti/Al" (graph f).

It can therefore be said that the high reflectivity material layer of the p-side ohmic reflection electrode is preferably made of Ag, Al, Rh, Pd or the like, and more preferably made of Ag, Al or the like.

Next, description will be made on a thickness of the n-type ZnO substrate 51 after grinding.

Figure 5A:
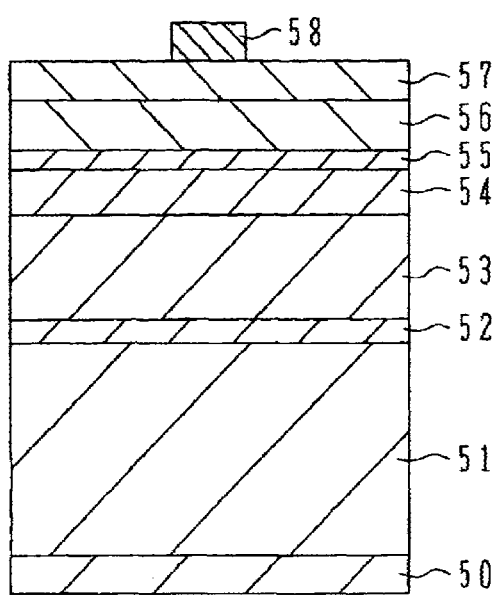
FIGS. 5A and 5B are schematic cross sectional views of a semiconductor light emitting device having an active layer made of ZnO based compound semiconductor.
Figure 5B:
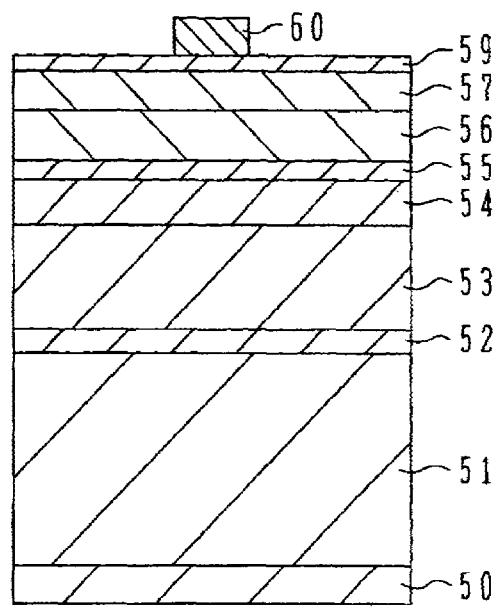

As described earlier, the n-type ZnO substrate 51 provides a manufactured semiconductor light emitting device with a current diffusion function and contributes to an increase in a light emission amount of the semiconductor light emitting device. Generally, an n-type ZnO film has a carrier mobility larger by two digits than that of a p-type ZnO film, and has a resistivity smaller by two digits. Therefore, the n-type ZnO substrate 51 of the embodiment can exhibit a satisfactory current diffusion function at a thickness much thinner than that of the p-type ZnO layer of a semiconductor light emitting device shown in FIG. 5A or 5B. However, if the n-type ZnO substrate 51 is too thin, it becomes difficult for current to diffuse in the in-plane directions because the traveling distance in the thickness direction becomes very short as compared with the travelling distance in the in-plane directions.

Therefore, it is preferable to grind the n-type ZnO substrate 51 to a thickness matching the resistivity of the n-type ZnO substrate and the size of the semiconductor light emitting device. For example, assuming that the size of the semiconductor light emitting device shown in FIG. 1H is 350 μm×350 μm in the in-plane directions, that the n-side ohmic electrode 70 is formed in the middle and that the resistivity of the n-type ZnO substrate 51 is 0.1 Ωcm which is a typical resistivity, the thickness of the n-type ZnO substrate 51 is required to be about 5 μm or larger, or in more preferably, about 10 μm or larger from the viewpoint of current diffusion.

Next, a thickness of the n-type ZnO substrate 51 will be studied from the viewpoint of absorption of light emitted from the active layer.

Reference is made again to FIG. 3. Light having a wavelength of 400 nm is not absorbed in the ZnO substrate, whereas light having wavelengths of 390 nm and 395 nm has an optical absorption factor increasing as the ZnO substrate becomes thicker.

Since the relation between the thickness and the optical absorption factor of a substrate varies with the wavelength, the thickness of the n-type ZnO substrate 51 can be properly determined in accordance with the wavelength of light emitted from the active layer and the wavelength of light to be output to the exterior.

For example, if the active layer is made of ZnOSe having an emission center wavelength of 405 nm and emitting light having a half bandwidth of 17 nm, the thickness of the n-type ZnO substrate 51 is preferably set to about 90 μm or thinner in order to suppress absorption of light having a wavelength of 395 nm or shorter to 0.1 or smaller.

The present inventors have vigorously researched into materials suitable for the active layer 55, considering the light absorption in the n-type ZnO substrate 51.

A ZnO substrate is synthesized by a hydrothermal synthesis method, a chemical vapor transport (CVT) method, a flux method or the like. ZnO is crystal having the wurtzite structure (hexagonal system) and has an energy gap of about 3.4 eV (3.361 eV). The wavelength corresponding to this energy gap is 365 nm, and the absorption edge of optical absorption is at a wavelength slightly shorter than 365 nm.

However, an actual ZnO substrate absorbs light (longer wavelength light) having a wavelength corresponding to an energy gap narrower to some degree than the actual energy gap, because of imperfect crystallinity of the substrate and the like.

Therefore, as shown in the graph of FIG. 3, for example, light having a wavelength of 390 nm is absorbed by about 50% in a ZnO substrate of 40 μm in thickness, and by 80 to 90% in a ZnO substrate of 100 μm in thickness. However, light having a wavelength of 395 nm has an optical absorption factor of 3 to 4% in a ZnO substrate having a thickness of 40 μm or thinner. Light having a wavelength of 400 nm has an optical absorption factor of almost 0 in a ZnO substrate of up to 500 μm in thickness.

The optical emission efficiency of a semiconductor light emitting device can therefore be improved by forming an active layer made of material that emits light having a wavelength (in vacuum) of 395 nm or longer, and more preferably a wavelength (in vacuum) of 400 nm or longer.

As described earlier, an active layer can be formed preferably by using CdZnO, ZnOSe, ZnOS or the like. CdZnO, ZnOSe and ZnOS are generic names of compounds generally expressed by $Cd_xZn_{1-x}O$, $ZnO_{1-y}Se_y$, and $ZnO_{1-z}S_z$, respectively.

First, a desired range of Cd composition (x) will be studied using CdZnO($Cd_xZn_{1-x}O$). The energy gaps of CdO and ZnO are about 2.2 eV and about 3.361 eV, respectively. It is therefore possible to form an active layer radiating light having a wavelength of 395 nm or longer by using crystal expressed by $Cd_xZn_{1-x}O$.

Figures 6A, 6B:
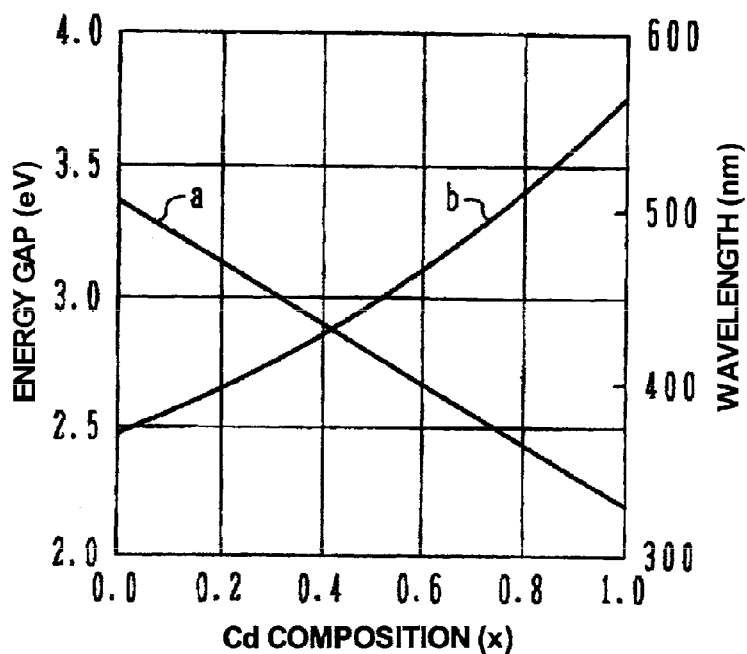
FIG. 6A is a graph showing a Cd composition (x) dependency of the energy gap and the gap wavelength (the energy gap wavelength) of $Cd_xZn_{1-x}O$.
FIG. 6B is a table showing the values of the Cd compositions (x) and energy gaps when light is emitted at wavelengths of 390 nm, 395 nm, 400 nm and 455 nm, respectively.

FIG. 6A is a graph showing a Cd composition (x) dependency of the energy gap and the gap wavelength of $Cd_xZn_{1-x}O$.

The abscissa of the graph represents a value of a Cd composition (x), and the ordinate represents the energy gap and the corresponding gap wavelength in the units of "eV" and "nm", respectively.

The curve a indicates the relation between the Cd composition (x) and the energy gap, and the curve b indicates the relation between the Cd composition (x) and the gap wavelength.

As the Cd composition (x) increases, the energy gap narrows and the corresponding gap wavelength becomes longer.

FIG. 6B is a table showing values of Cd compositions (x) and energy gaps when light is emitted having wavelengths of 390 nm, 395 nm, 400 nm and 455 nm.

At a Cd composition (x) of 0.19, light is radiated at a wavelength of 395 nm, and at a Cd composition (x) of 0.23, light is radiated at a wavelength of 400 nm.

It can be understood from FIGS. 6A and 6B that when an active layer is formed by using $Cd_xZn_{1-x}O$, the Cd composition (x) is preferably 0.19 or larger and more preferably 0.23 or larger.

Next, a desired range of Se composition (y) will be studied using ZnOSe($ZnO_{1-y}Se_y$).

Figure 7A:
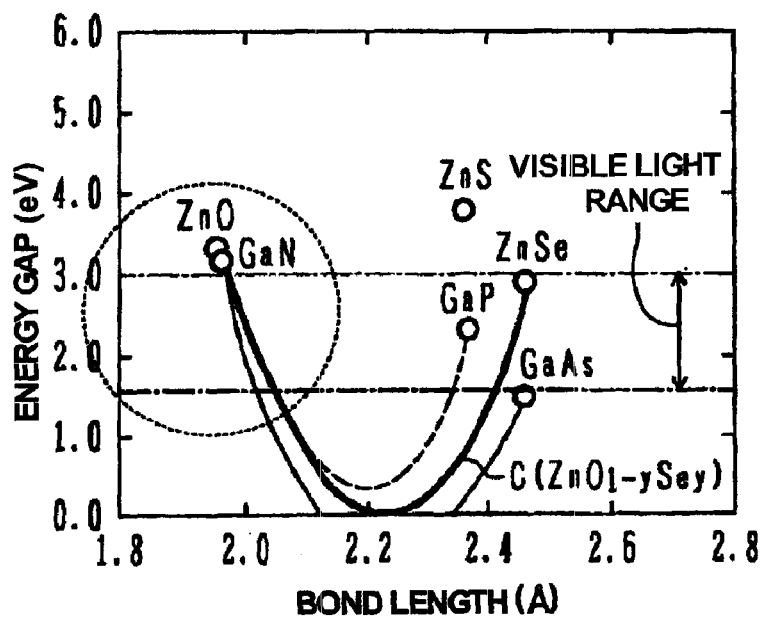
FIG. 7A is a graph showing a bond length dependency of the energy gap of various types of compound.

FIG. 7A is a graph showing a bond length dependency of an energy gap of several kinds of compounds. The curve c indicates the bond length dependency of ZnOSe($ZnO_{1-y}Se_y$).

The abscissa of the graph represents the bond length in the unit of "angstrom" and the ordinate represents the energy gap in the unit of "eV".

Reference is made to the curve c. A change amount in the energy gap relative to a change amount in a bond length is large. An energy gap of ZnOSe($ZnO_{1-y}Se_y$) crystal bows greatly relative to a doping amount of Se. This characteristic causes ZnOSe($ZnO_{1-y}Se_y$) crystal to have a significantly longer optical emission wavelength with a small increase in the doping amount of Se.

Figure 7B:
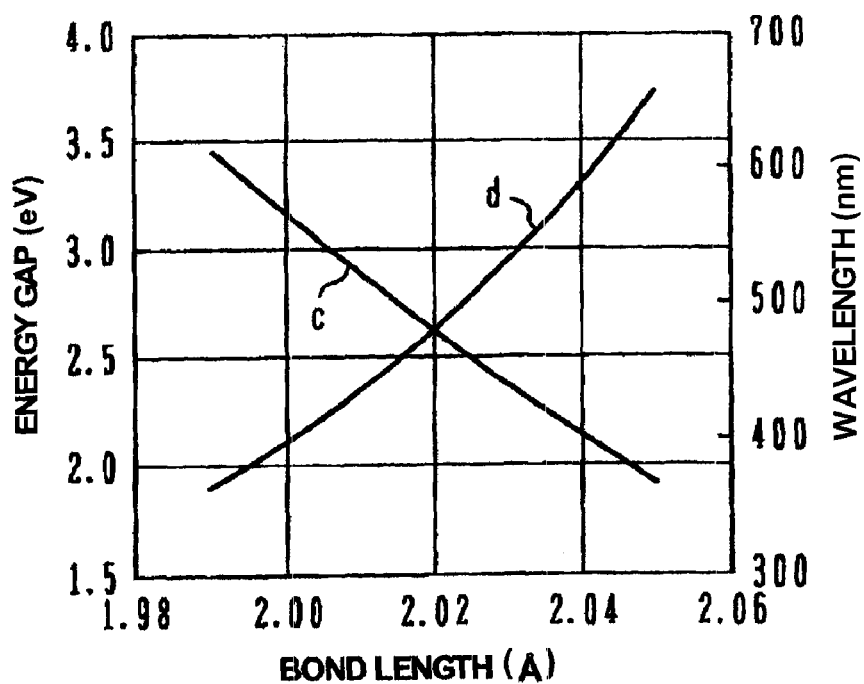
FIG. 7B is a graph showing the details of a curve c located in the range surrounded by a broken line circle shown in FIG. 7A and a curve d representative of the bond length dependency of the gap wavelength of $ZnOSe(ZnO_{1-y}Se_y)$ in the range.

FIG. 7B is a graph showing the details of the curve c in the range surrounded by a broken line circle in FIG. 7A, and the curve d indicating the bond length dependency of the corresponding gap wavelength of ZnOSe($ZnO_{1-y}Se_y$) in this range.

The abscissa of the graph represents the bond length in the unit of "angstrom" and the ordinate represents the energy gap and the corresponding gap wavelength in the units of "eV" and "nm", respectively.

In the range shown in the graph, as the bond length elongates, the energy gap narrows (curve c) and the wavelength becomes longer (curve d).

Figures 7C, 7D:
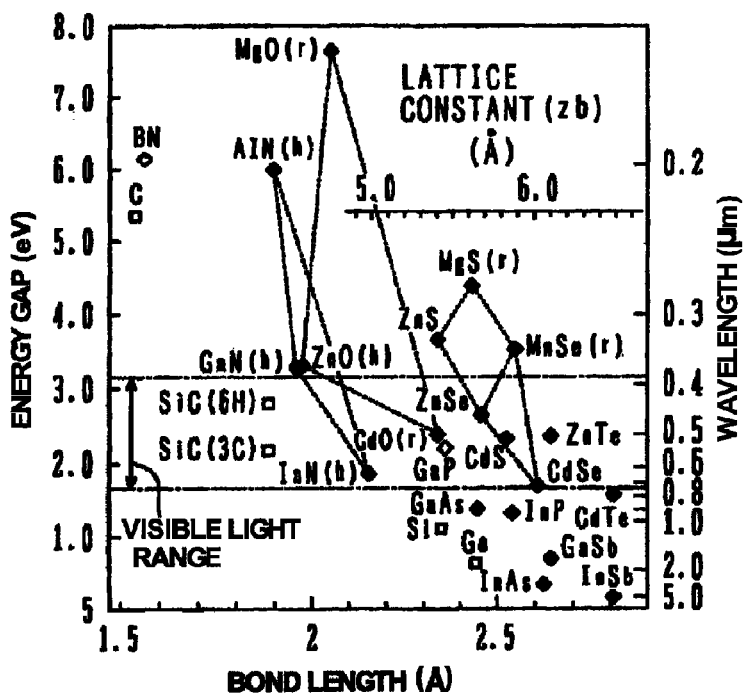
FIG. 7C is a table showing values of the bond lengths, energy gaps and gap wavelengths relative to discrete values of an Se composition (y) in the range of 0 to 0.1316.
FIG. 7D is a diagram showing the relation between bond lengths and energy gaps/wavelengths of various crystals.

FIG. 7C is a table showing values of bond lengths, energy gaps and wavelengths at discrete values of Se composition (y) in the range from 0 to 0.1316.

At an Se composition (y) of 0.0210, light is radiated at a wavelength of 395 nm, and at an Se composition (y) of 0.0240, light (near ultraviolet light) is radiated at a wavelength of 400 nm. As an Se composition (y) is increased in the range of 0.0240 or larger, light hardly absorbed by the substrate can be radiated at wavelengths of 460 nm (blue), 550 nm (green), 580 nm (yellow) and 630 nm (red) at Se compositions (y) of 0.0565, 0.0955, 0.1064 and 0.1227, respectively. As the Se composition (y) is increased further, infrared light may be radiated. There may exist a limit in a longer wavelength because ZnOSe may become immiscible.

As described above, when an active layer is formed by using $ZnO_{1-y}Se_y$, the Se composition (y) is preferably 0.0210 or larger and more preferably 0.0240 or larger. Since ZnOSe crystal has a large bowing parameter, it is possible to form a semiconductor light emitting diode capable of radiating light from near ultraviolet light to green light by using ZnOSe mixed crystal as the material of the active layer (also for the well layer or barrier layer of the active layer).

FIG. 7D shows the relation between the bond length and the energy gap/wavelength of various crystals.

As seen in this diagram, the bond length of ZnO is 1.99 angstroms and the bond length of ZnSe is 2.45 angstroms, providing a relatively large difference. However, $ZnO_{1-y}Se_y$ has a bowing characteristic and a small difference between Se compositions (y) exhibits a considerable difference in energy gap wavelength. Therefore, when the active layer is formed by using $ZnO_{1-y}Se_y$, an undesirably large increase in the bond length does not occur even if Se is doped to attain a longer gap wavelength. This is beneficial from the standpoint of lattice constant matching.

Next, a desired range of S composition (z) will be studied using ZnOS($ZnO_{1-z}S_z$).

Figure 8A:
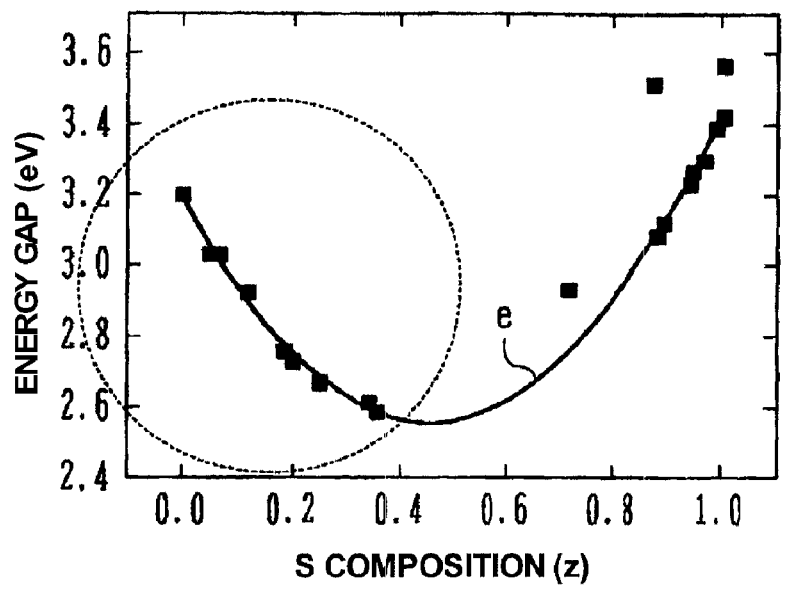
FIG. 8A is a graph showing the relation between an S composition (z) and an energy gap of $ZnOS(ZnO_{1-z}S_z)$.

FIG. 8A is a graph showing the relation between the S composition (z) and the energy gap. The relation is indicated by the curve e.

The abscissa of the graph represents the S composition (z) and the ordinate represents the energy gap in the unit of "eV".

As indicated by the curve e, similar to ZnOSe($ZnO_{1-y}Se_y$), the energy gap of ZnOS($ZnO_{1-z}S_z$) crystal bows greatly relative to a doping amount of S. This characteristic causes ZnOS ($ZnO_{1-z}S_z$) crystal to have a significantly longer optical emission wavelength with a small increase in the doping amount of S.

Figure 8B:
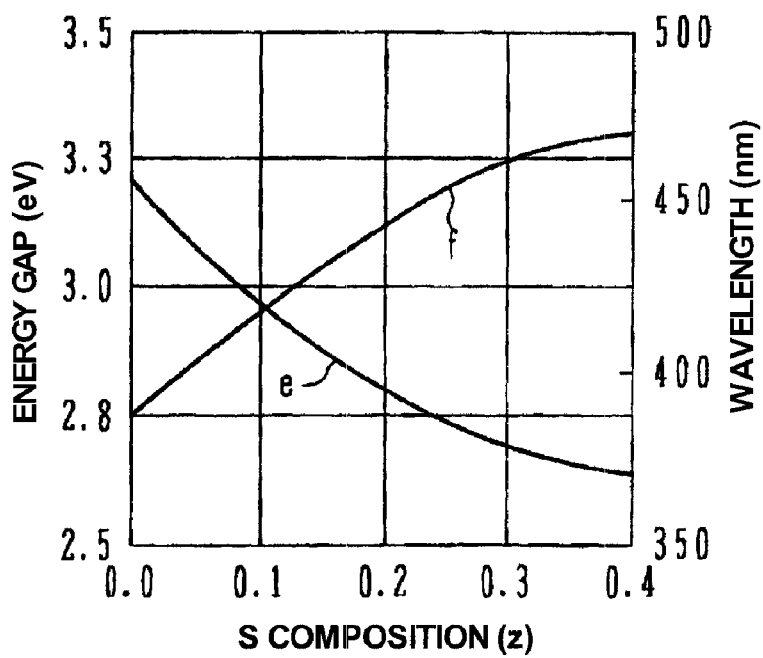
FIG. 8B is a graph showing the details of a curve e located in the range surrounded by a broken line circle shown in FIG. 8A and a curve f representative of the S composition (z) dependency of the gap wavelength of $ZnOS(ZnO_{1-z}S_z)$ in the range.

FIG. 8B is a graph showing the details of the curve e in the range surrounded by a broken line circle in FIG. 8A, and the curve f indicates the S composition (z) dependency of the gap wavelength of ZnOS($ZnO_{1-z}S_z$) in this range.

The abscissa of the graph represents the S composition (z) and the ordinate represents the energy gap and the corresponding gap wavelength in the units of "eV" and "nm", respectively.

In the range shown in the graph, as the S composition (z) increases, the energy gap narrows (curve e) and the wavelength becomes longer (curve f).

FIG. 8C is a table showing values of energy gaps and wavelengths at discrete values of S composition (z) in the range from 0.009 to 0.400.

At an S composition (z) of 0.025, light is radiated at a wavelength of 395 nm, and at an S composition (z) of 0.040, light is radiated at a wavelength of 400 nm (near ultraviolet light). At an S composition (z) of 0.295, light is radiated at a wavelength of 460 nm (blue light). As the S composition (z) is further increased, light from green light to infrared light may be radiated.

As described above, when an active layer is formed by using $ZnO_{1-z}S_z$, the S composition (z) is preferably 0.025 or larger and more preferably 0.040 or larger. Since ZnOS crystal has a large bowing parameter, it is possible to form a semiconductor light emitting diode capable of radiating light from near ultraviolet light to infrared light by using ZnOS mixed crystal as the material of the active layer (also for the well layer or barrier layer of the active layer).

Further, when the active layer is formed by using $ZnO_{1-z}S_z$, an undesirably large increase in the bond length does not occur even if S is doped to attain a longer gap wavelength. This is beneficial from the standpoint of lattice constant matching.

The refractive indices of ZnO, ZnSe and ZnS are 2.0, 2.6 and 2.49, respectively. Thus, the refractive index of ZnSe and ZnS are larger than that of ZnO. As Se or S is mixed with ZnO crystal, the band bowing occurs and the band gap narrows. Therefore, even if a composition ratio of Se or S becomes large, the refractive index does not become larger, but it can be expected that the refractive index becomes rather smaller. It can therefore be considered that the emission efficiency of the semiconductor light emitting device is not significantly affected by the change in the refractive index due to addition of Se or S.

The active layer may be doped with n-type impurities or p-type impurities, or may be undoped. As the n-type impurities replacing the Zn sites, Group III elements, such as Al, Ga and In can be used. As the n-type impurities replacing the oxygen (O) sites, Cl, Br, I and the like can be used. As the p-type impurities replacing the Zn sites, Group I elements such as Li, Na and K can be used. As the p-type impurities replacing the oxygen (O) sites, N, P, As and the like can be used.

By setting the wavelength of light emitted from the active layer to a wavelength longer than the absorption wavelength of the ZnO substrate, it becomes possible to suppress optical absorption of the ZnO substrate and to improve the emission efficiency of the semiconductor light emitting device. In view of the above considerations, the thickness of the ZnO substrate can be set to an appropriate value based on the absorption characteristics shown in FIG. 3 and the actual emission spectrum. Also if the emission spectrum is engineered such that the absorption by the ZnO substrate can be ignored, the thickness of the ZnO substrate can be set to a desired value based on other factors, such as about 70 μm to about 200 μm to allow easy die separation.

The present inventors have vigorously studied next the MgZnO layer (n-type MgZnO layer 54 and p-type MgZnO layer 56). MgZnO is a generic name of compound generally expressed by $Mg_wZn_{1-w}O$.

As MgZnO crystal is formed by adding Mg to ZnO crystal, the band gap becomes broad in accordance with an Mg composition (w). However, as described earlier, ZnO is crystal having the wurtzite structure (hexagonal system), whereas MgO crystal has a different crystal structure: the sodium chloride structure.

If an Mg composition (w) is small, $MgZnO(Mg_wZn_{1-w}O)$ has the wurtzite structure (hexagonal system), whereas if an Mg composition (w) is large, the crystal has the sodium chloride structure. If $MgZnO(Mg_wZn_{1-w}O)$ crystal has the sodium chloride structure, it is difficult to form a lamination structure (lamination by epitaxial growth) with ZnO crystal having the wurtzite structure (hexagonal system).

For example, in the Mg composition (w) range of about 0.46 or smaller, it is possible to form an $MgZnO(Mg_wZn_{1-w}O)$ layer by adding Mg, while $MgZnO(Mg_wZn_{1-w}O)$ is maintained to have the wurtzite structure.

When the active layer 55 is made of CdZnO having a high Cd composition, or ZnOSe, ZnOS, ZnOTe, or the like with an appropriate amount of additive (Se, S, Te, respectively), the n-type $MgZnO(Mg_wZn_{1-w}O)$ layer 54 and p-type MgZnO ($Mg_wZn_{1-w}O$) layer 56 have a sufficient barrier height at an Mg composition (w) of 0 (i.e., a ZnO layer) in some cases.

For these reasons, the Mg composition (w) of the n- and p-type $MgZnO(Mg_wZn_{1-w}O)$ layers 54 and 56 is preferably between 0 and about 0.46.

The n-type MgZnO layer 54 and p-type MgZnO layer 56 are not required to be both formed, but one of the layers may be formed. Impurities capable of being doped in the active layer described earlier may be used as n- or p-type impurities to be doped.

In order to raise an activation factor of impurities, delta doping may be performed. A super lattice structure of $[MgZnO(Mg_wZn_{1-w}O)/(ZnO$ doped with impurities$)]_n$ may also be adopted.

Figure 9:
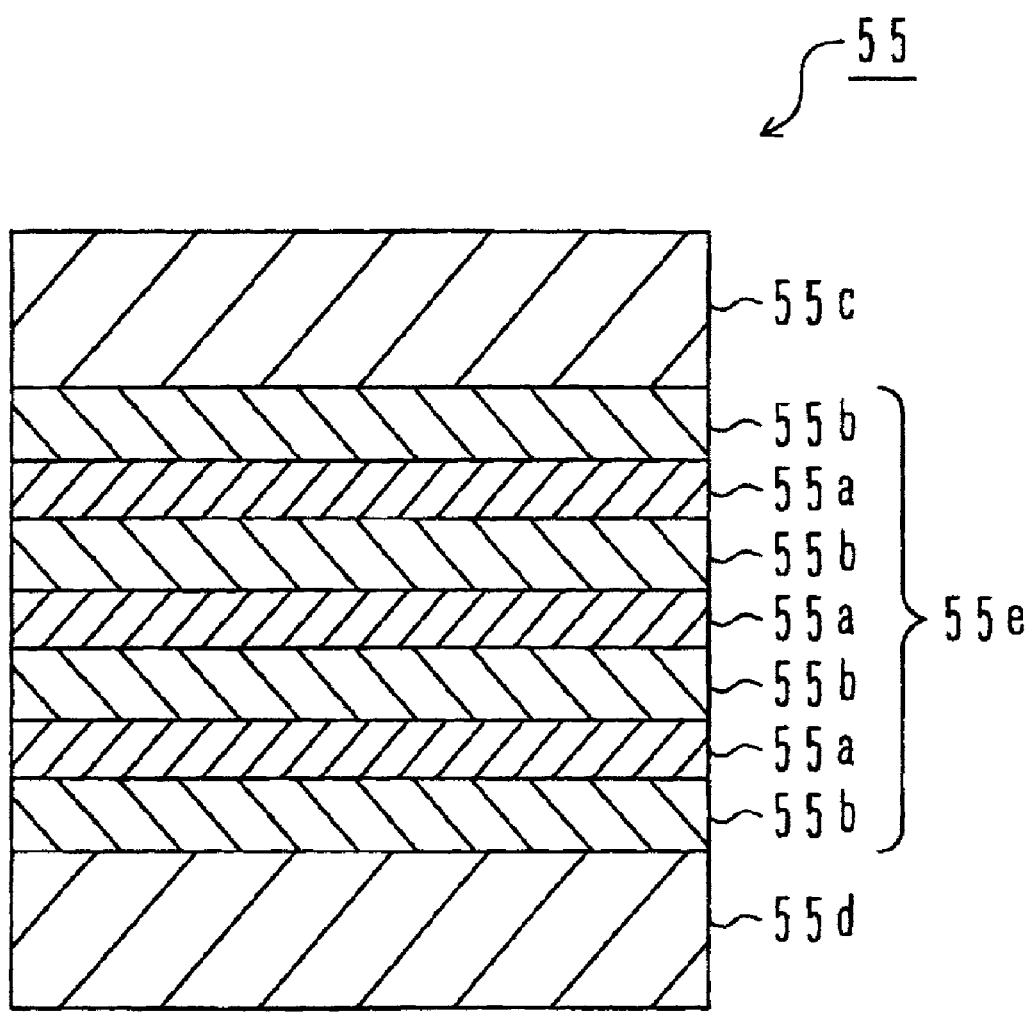
FIG. 9 is a schematic cross sectional diagram showing an example of the structure of an active layer 55.

FIG. 9 is a schematic cross sectional view showing an example of the structure of an active layer 55. With reference to FIG. 9, this example of the active layer 55 will be described in more detail.

In this example, the active layer 55 is constituted of an MQW (multiple quantum well) layer 55e, which actually emits light in operation, and transition layers 55c and 55d sandwiching the MQW layer 55e on both sides thereof in a thickness direction. For example, the transition layer 55d is formed on the n-type MgZnO layer 54 and the p-type MgZnO layer 56 is formed on the transition layer 55c.

The MQW layer 55e is made of a lamination structure of well layers 55a and barrier layers 55b. The portion indicated by 55e may also have various types of structures: (i) a type in which a barrier layer 55b and a well layer 55a are laminated in this order from the ZnO substrate side (from the bottom in FIG. 9) and there are two or more lamination structural bodies of the layers 55a and 55b ending with an additional barrier layer 55b (type shown in FIG. 9); (ii) a type in which a well layer 55a and a barrier layer 55b are laminated in this order from the ZnO substrate side (from the bottom in FIG. 9) and there are two or more lamination structural bodies of the layers 55a and 55b; (iii) a type in which a well layer 55a is sandwiched by barrier layers 55b; (iv) a type in which a barrier layer 55b is sandwiched by well layers 55a; and other types. Among these various possible structures, a type that provides a high optical emission efficiency may be selected depending on the design needs.

The well layer 55a may be made of a material selected from CdZnO, ZnOS, ZnOSe and ZnOTe, or may be made of a mixture of two or more of these crystals.

The barrier layer 55b may be made of a material selected from MgZnO, ZnO, CdZnO, ZnOS, ZnOSe and ZnOTe, or may be made of a mixture of two or more of these crystals, having a larger energy gap than the well layer 55a.

The optical emission wavelength depends on a crystal composition of the well layer 55a, a crystal composition of the barrier layer 55b, thicknesses of the layers 55a and 55b and the like. Since the QW structure broadens an effective band gap, if the active layer (e.g., well layer) is made of $Cd_xZn_{1-x}O$, it is preferable to use a Cd composition (x) amount that is appropriately larger than the value selected from the above-described preferred Cd composition (x) range (0.19 or larger, more preferably 0.23 or larger).

Similarly, if the active layer (e.g., well layer) is made of $ZnO_{1-y}Se_y$ or $ZnO_{1-z}S_z$ it is preferable to use a composition amount that is appropriately larger than the value selected within the above-described preferred composition ranges.

The thickness of the well layer 55a is, for example, about 1 nm to about 5 nm, and the thickness of the barrier layer 55b is, for example, about 2 nm to about 15 nm.

The active layer 55 may have an SQW structure or a DH structure instead of the MQW structure.

The transition layers 55c and 55d will be described. Each of the transition layers 55c and 55d is a composition change layer for reducing a junction barrier (spike) between the p-type MgZnO layer 56 and MQW layer 55e and between the n-type MgZnO layer 54 and MQW layer 55e. For example, the transition layer is made of $Mg_vZn_{1-v}O$ ($v1 \leq v \leq v2$) and has the structure that the Mg composition (v) changes continuously (from v2 to v1) in the thickness direction toward the MQW layer 55e. The Mg composition (v) may be changed stepwise. These layers help enhance carrier injection into the MQW layer 55e.

The transition layers 55c and 55d may function as a carrier concentration adjusting layer; i.e., these layers help establish an appropriate position of a junction region in the MQW layer 55e when the device is operated.

The transition layers 55c and 55d may have a super lattice structure to relax strains in the MQW layer 55e. In this case, crystallinity of the active layer 55 can be improved.

With the transition layers 55c and 55d properly formed as described above, the optical emission efficiency of the QW layer can be increased, for example.

In FIG. 9, although the transition layers are formed on both sides of the MQW layer 55e, the transition layer may be formed only on one side.

Lastly, the support structural body including the silicon substrate 64 will be described.

If an optical emission wavelength of the semiconductor light emitting device is absorbed by the ZnO substrate to some degree (e.g., the emission spectrum includes wavelengths shorter than 395 nm), it is effective that the lamination structural body having the optical emission lamination structure is bonded to the support structural body and thereafter the n-type ZnO substrate 51 is ground to a certain thickness, as in the manufacture method described with reference to FIGS. 1A to 1H.

However, if the optical emission wavelength of the semiconductor light emitting device sufficiently exceeds 400 nm, it may not be necessary to thin the n-type ZnO substrate 51 from the viewpoint of optical absorption. In such a case, one may choose to omit the manufacture processes for the support structural body and the bonding process for the support structural body and lamination structural body. For example, after forming the structure that includes the optical emission lamination structure 61, n-type ZnO substrate 51, p-side ohmic reflection electrode 62 and n-side ohmic electrode 70, a permanent substrate suitable for this purpose is selected in place of the support structural body and the permanent substrate is bonded to the structure. Since bonding can be performed on the whole area of the structure in the in-plane direction, this bonding provides no manufacturing challenge.

The permanent substrate may be a Si wafer, a Si submount, a horn type silicon, and in addition, ceramic having lead wirings to the permanent substrate such as alumina and aluminum nitride. Examples of the metalized ceramic include Au/alumina, Ag/alumina, Al/alumina, Au/aluminum nitride, Ag/aluminum nitride, and Al/aluminum nitride.

High heat dissipation conducive intermetallic compound such as CuW may also be used as the permanent substrate. It is also possible to use metal material such as Au, Al, Ag/Cu, Al/Cu, and invar (ultra low thermal expansion metal) subjected to an adhesion surface process for the structure.

For example, a thermal conductivity of ZnO is about 30 (W/mK), whereas thermal conductivities of Cu, aluminum nitride (ceramic) and CuW are about 200, about 200 or 250 to 270 and about 200 (W/mK), respectively.

If the active layer is formed to emit light in a wavelength range longer than 395 nm (or more preferably in a wavelength range longer than 400 nm), it is possible to use a permanent substrate of various materials and to form a semiconductor light emitting device excellent in thermal dissipation, for example.

The ZnO based compound semiconductor light emitting device is suitable for use in a display, an indicator, an illumination light source, a backlight and the like.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor light emitting device manufacture method comprising:
    (a) preparing a first substrate of an n-type ZnO substrate;
    (b) forming a lamination structure including an optical emission layer made of ZnO based compound semiconductor over said first substrate;
    (c) forming a p-side conductive layer over said lamination structure;
    (d) forming a first eutectic material layer made of eutectic material over said p-side conductive layer;
    (e) preparing a second substrate having an electric conductivity;
    (f) forming a second eutectic material layer made of eutectic material over said second substrate;
    (g) performing eutectic bonding of said first eutectic material layer and said second eutectic material layer so that the first substrate is oriented upside down; and
    (h) forming an n-side electrode over a partial surface of said first substrate.

2. The semiconductor light emitting device manufacture method according to claim 1, further including a step (i) of thinning said first substrate after step (g).

3. The semiconductor light emitting device manufacture method according to claim 2, further including a step (j) of forming a textured surface in said first substrate after step (i).

4. The semiconductor light emitting device manufacture method according to claim 2, wherein said step (i) includes grinding a surface of the first substrate.

5. The semiconductor light emitting device manufacture method according to claim 3, wherein said step (j) includes dry or wet etching a surface of said first substrate to form said textured surface.

6. The semiconductor light emitting device manufacture method according to claim 2, wherein said step (i) thins said first substrate to have a remaining thickness of about 5 μm or thicker.

7. The semiconductor light emitting device manufacture method according to claim 1, wherein in said step (c), said p-side conductive layer includes an ohmic material layer capable of having an ohmic contact with said lamination structure and a high reflectivity material layer made of Ag, Al, Pd or Rh.

8. The semiconductor light emitting device manufacture method according to claim 1, wherein an area of said second substrate is larger than an area of said first substrate.

9. The semiconductor light emitting device manufacture method according to claim 1, wherein said second substrate is a silicon substrate doped with n- or p-type impurities.

10. A semiconductor light emitting device manufacture method comprising:

preparing a first substrate of an n-type ZnO substrate;

forming a lamination structure including an optical emission layer made of ZnO based compound semiconductor over said first substrate;

forming a p-side conductive layer over said lamination structure;

preparing a second substrate;

thereafter bonding the first substrate that is turned upside down to the second substrate such that a p-side conductive layer side of the first substrate faces the second substrate; and forming an n-side electrode over a partial area of a surface of said first substrate that is opposite to the p-side conductive layer side.

* * * * *